Figure 1:
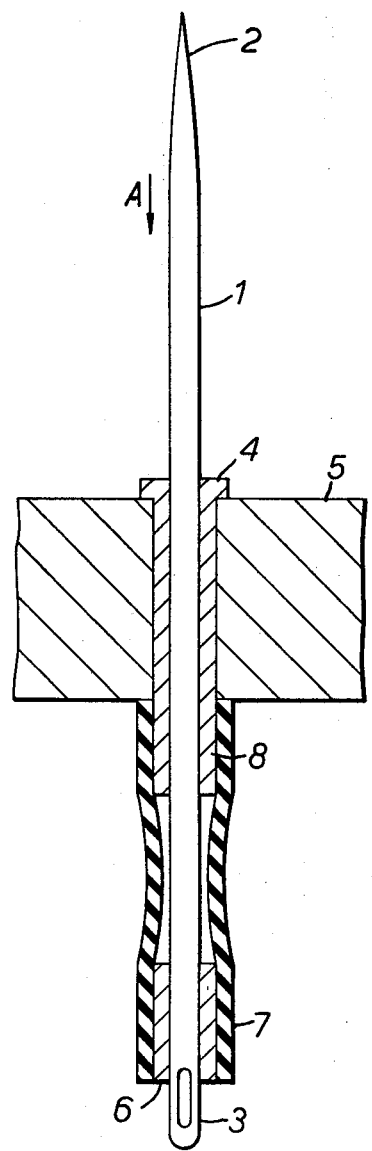

United States Patent [19]

Smith

[11] 4,403,822

[45] Sep. 13, 1983

[54] ELECTRICAL PROBE APPARATUS

[75] Inventor: John L. Smith, St. Albans, England

[73] Assignee: Marconi Instruments Limited, Chelmsford, England

[21] Appl. No.: 173,368

[22] Filed: Jul. 29, 1980

[30] Foreign Application Priority Data

Jul. 31, 1979 [GB] United Kingdom ............... 7926635

[51] Int. Cl.³ .................... H01R 13/24; G01R 1/06
[52] U.S. Cl. ........................ 339/108 TP; 339/255 R; 324/158 F; 324/158 P
[58] Field of Search ........ 339/255 R, 108 TP, 186 M, 339/66 M, 211, 75 M, 255 R, 48; 324/158 F, 72.5, 158 P, 61 P

[56] References Cited

U.S. PATENT DOCUMENTS

| | | | |
|---|---|---|---|
| 2,438,350 | 3/1948 | Reichard | 339/255 R X |
| 2,515,004 | 7/1950 | Haupt | 324/72.5 |
| 2,682,649 | 6/1954 | Blonder | 339/255 R X |
| 2,742,626 | 4/1956 | Collins et al. | 339/255 R X |
| 3,411,125 | 11/1968 | Hill | 324/72.5 X |
| 4,017,793 | 4/1977 | Haines | 324/158 F X |
| 4,298,239 | 11/1981 | Montalto et al. | 339/255 R X |

Primary Examiner—Joseph H. McGlynn
Assistant Examiner—John S. Brown
Attorney, Agent, or Firm—Spencer, Kaye & Frank

[57] ABSTRACT

An electrical probe apparatus for facilitating the testing of printed circuit boards is constructed in a gas tight manner. This allows the printed circuit board to be held by suction without losing vacuum pressure through the probe. A silicon rubber sleeve serves as the vacuum seal, and its resilience urges the probe into firm contact with the circuit under test.

11 Claims, 2 Drawing Figures

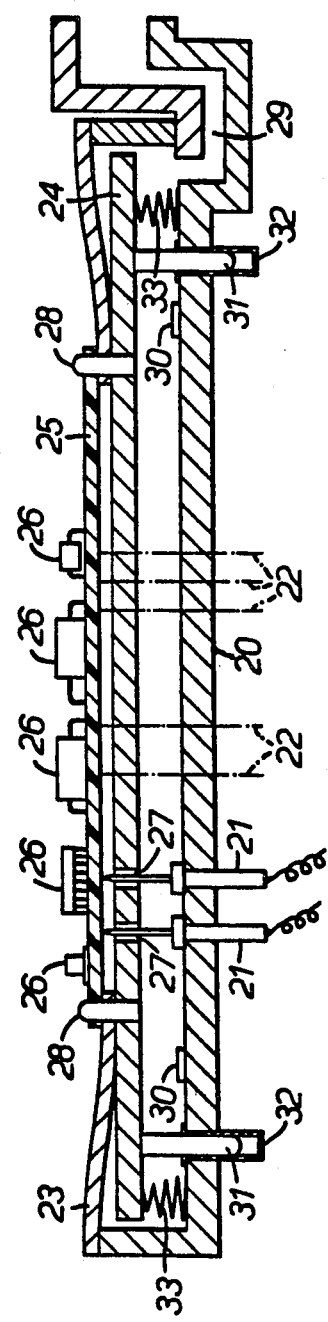

ELECTRICAL PROBE APPARATUS

This invention relates to electrical probe apparatus and is particularly concerned with apparatus whereby electrical contact can readily be made to one or more selected points in an electrical circuit for the purpose of testing it. In particular, it is common to fabricate circuits on what are generally termed printed circuit boards— that is to say, a board having an insulating surface on which conductive tracks are formed. Usually the tracks are provided for the purpose of electrically interconnecting electronic components which are also mounted on the circuit board.

According to this invention, an electrical probe apparatus includes an elongate electrically conductive probe slidably mounted in an apertured member with one end of the probe arranged to project from said member; and a resiliently deformable tubular sleeve arranged to surround a portion of the probe with one end of the sleeve being secured to the probe and the other end being secured to said member so as to form a gas tight seal between said one end of the probe and said member.

In operation the probe is used to contact an electrical circuit to enable tests and measurements to be performed on it.

Preferably both ends of the probe project from the apertured member and said sleeve is secured to that end of the probe which is remote from said one end. In operation, it is the said one end which contacts the circuit under test and in this case when the electrical circuit is brought into contact with said one end, the sleeve is tensioned and deformed by movement of the probe relative to said apertured member so that it exerts a force which holds the probe firmly in contact with the electrical circuit.

Preferably a plurality of probes are provided so that in use a number of circuit points can be contacted simultaneously.

Preferably again said plurality of probes are each provided with a separate apertured member, with all probes being mounted on a common rigid plate. Conveniently each apertured member is in the form of a bush.

It is generally desirable for the probes to be electrically insulated from each other, and to achieve this the apertured members in which the probes are slidably mounted can be composed of an electrically insulating material. This restricts the nature of the material from which the members can be formed, and in general it is instead preferred to form the common plate from an insulating material. This allows the apertured members to be formed of a relatively hard metal with satisfactory wear resistant properties.

Preferably said plate forms part of an enclosure to which reduced gas pressure can be applied so as to hold a circuit board firmly in contact with the ends of the probes by means of suction (i.e. a partial vacuum). The presence of the sleeve on each probe prevents passage of gas around the probe which would otherwise degrade the effectiveness of the suction.

Preferably the sleeve is formed of a silicon rubber, and preferably again the sleeve is (in its relaxed undeformed state) in the shape of an elongate hollow cylinder of constant diameter and wall thickness.

The invention is further described by way of example with reference to the accompanying drawings in which, FIG. 1 illustrates an electrical probe apparatus in accordance with the present invention and which consists of a single probe, and FIG. 2 shows a more complex electrical probe apparatus having a relatively large number of probes.

Referring to FIG. 1, a probe 1 is provided in the shape of an elongate electrically conductive rod having a sharp point 2 at one end which, in operation, is arranged to contact an electrical circuit under test, and an aperture at the other end 3 to which an electrical lead can be attached. The probe 1 is slidably mounted in a brass bush 4 which is in turn tightly force fit in an apertured supporting plate 5. A short cylindrical collar 6 is securely fixed to the end 3 of the probe with a short tubular sleeve 7 arranged to connect the collar 6 to the bush 4 as shown. The sleeve 7 is formed of a short length of silicon rubber tubing which has a relaxed diameter of slightly less than the diameter of the collar 6 and the projecting portion 8 of the bush 4 to which it is attached. Thus the sleeve 7 serves to locate the probe relative to the plate 5.

When an electrical circuit is brought into contact with the point 2 of the probe 1, the probe is displaced in the direction of the arrow A relative to the plate 5. This causes the sleeve 7 to be stretched and the tension in the sleeve produces a reaction force serving to hold the probe firmly in contact with the electrical circuit. Because the sleeve 7 allows a significant degree of longitudinal movement of the probe relative to the plate 5, the position of the electrical circuit is not critical. When the electrical circuit is removed, the resilience of the sleeve 7 restores the probe 5 to its original position.

It will be appreciated that a gas pressure difference can exist between the two surfaces of the plate 5, since the arrangement of the sleeve 7 prevents gas passing from one side of the plate 5 to the other.

FIG. 2 shows a more complex electrical probe apparatus in which a large number of probes are used to contact different points on a complex printed circuit board.

Referring to FIG. 2, a plate 20, which is formed of an insulating material, is provided with a number of individual probe assemblies 21, each probe assembly being of the form illustrated in FIG. 1. Only two such probe assemblies 21 are illustrated, but the lines 22 indicate typical positions for further probe assemblies and in practice very many could be provided, since the plate 20 extends in two dimensions, so that the probe assemblies in general will not follow in a single line, but instead a two dimensional array will exist. The electrical probe apparatus is also provided with a flexible sealing sheet 23 and a movable carriage 24. The sheet 23 is provided with a large central window which is slightly smaller than the size of a printed circuit board 25 under test. In practice, the printed circuit board 25 constitutes an electrical circuit which may be relatively complicated and carry a large number of individual electrical components. Examples of electrical components 26 are illustrated and these may comprise capacitors, resistors, transistors, logic circuits, etc. These are shown mounted on the upper surface of the printed circuit board 25 and these are interconnected by means of conductive copper tracks formed on the lower surface of the board 25. It is these conductive tracks which are contacted by the probes in the probe assemblies 21. The carriage 24 is provided with appropriate apertures 27 to allow the probes to pass freely through so as to contact the circuit board 25 as necessary.

In use, a printed circuit board 25 is initially placed loosely over the sheet 23 and located relative to the carriage 24 by means of pins 28, which pass through precisely located apertures. It is important to locate the printed circuit board 25 accurately relative to the carriage 24 and hence relative to the probe assemblies 21 by way of the guide pins 31 and bushes 32 to ensure that the individual probes touch the correct portion of the conductive tracks. When the board 25 has been correctly located, suction is applied to the gas port 29, by connecting it to a vacuum line, for example. This has the effect of sealing the board 25 to the sheet 23, and since this sheet 23 is flexible, it is deformed and sucked downwards with the carriage 24 depressing the springs 33 until further movement is prevented by abutments 30. The length of the probes is such that they are arranged to contact the underside of the board 25 before the carriage 24 comes into contact with the abutments 30. By this means the probes make excellent electrical contact to required locations of the conductive tracks for so long as suction is applied to the board 29. Since no air is allowed to seep into the enclosure via the probe assemblies 21, the suction may be maintained indefinitely as required.

I claim:

1. An electrical probe apparatus comprising: a plurality of elongate electrically conductive probes; an apertured member in which said probes are slidably mounted, with one end of each said probe projecting from said member; and a plurality of resiliently deformable tubular sleeves each surrounding a portion of a respective one of said probes, with one end of each said sleeve being secured to a respective one of said probes and the other end of each said sleeve being secured to said member so as to form a gas tight seal between said one end of each said probe and said member, wherein when said apparatus is in use said plurality of probes can simultaneously contact a number of circuit points.

2. An apparatus as claimed in claim 1 and wherein both ends of each said probe project from the apertured member, and each said sleeve is secured to that end of a respective one of said probes which is remote from said one end.

3. An apparatus as claimed in claim 1 and wherein said plurality or probes are each provided with a separate apertured member, with all probes being mounted on a common rigid plate.

4. An apparatus as claimed in claim 3 and wherein each apertured member is a bush.

5. An apparatus as claimed in claim 3 and wherein the common plate is formed from an insulating material.

6. An apparatus as claimed in claim 3 and wherein said plate forms part of an enclosure to which reduced gas pressure can be applied so as to hold a circuit board firmly in contact with the ends of the probes by means of suction.

7. An apparatus as claimed in claim 1 and wherein each said sleeve is formed of silicon rubber.

8. An apparatus as claimed in claim 7 and wherein each said sleeve is (in its relaxed undeformed state) in the shape of an elongate hollow cylinder of constant diameter and wall thickness.

9. An electrical probe apparatus comprising an elongate electrically conductive probe, an apertured member in which said probe is slidably mounted, with one end of said probe projecting from said member, and a resiliently deformable tubular sleeve surrounding a portion of said probe, with one end of said sleeve being fixed to, and movable with, said probe and the other end of said sleeve being fixed to said member so as to form a gas tight seal between said one end of said probe and said member, wherein a normal longitudinal position of said probe relative to said member is established solely by said sleeve.

10. An apparatus as defined in claim 9, further comprising means for permanently connecting an electrical lead directly to the end of said probe remote from said one end of said probe.

11. An electrical probe apparatus comprising an elongate electrically conductive probe, an apertured member in which said probe is slidably mounted, with one end of said probe projecting from said member, a resiliently deformable tubular sleeve surrounding a portion of said probe, with one end of said sleeve being fixed to, and movable with, said probe and the other end of said sleeve being fixed to said member so as to form a gas tight seal between said one end of said probe and said member and to establish a normal longitudinal position of said probe relative to said member, and means for permanently connecting an electrical lead directly to the end of said probe remote from said one end of said probe.

* * * * *